United States Patent [19]
Nightingale et al.

[11] Patent Number: 6,061,374
[45] Date of Patent: *May 9, 2000

[54] LASER DIODE INTEGRATING ENCLOSURE AND DETECTOR

[75] Inventors: John Lawrence Nightingale, Portola Valley; Matthew Rekow, Santa Cruz, both of Calif.

[73] Assignee: Coherent, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/876,847

[22] Filed: Jun. 17, 1997

Related U.S. Application Data

[60] Provisional application No. 60/037,476, Feb. 7, 1997.

[51] Int. Cl.[7] .................................. H01S 3/13; G02B 6/00
[52] U.S. Cl. ................................. 372/43; 385/88; 385/92; 385/93; 385/94
[58] Field of Search .......................... 372/43; 385/88.89, 385/92.93, 94, 12.33

[56] References Cited

U.S. PATENT DOCUMENTS

| | | | |
|---|---|---|---|
| 4,119,363 | 10/1978 | Camlibel et al. | 250/552 |
| 4,266,089 | 5/1981 | Scherer | 174/52 FP |
| 4,865,410 | 9/1989 | Estrada et al. | 350/96.2 |
| 4,997,243 | 3/1991 | Aiki et al. | 350/96.2 |
| 5,043,775 | 8/1991 | Lee | 357/19 |
| 5,127,072 | 6/1992 | Blauvelt et al. | 385/88 |
| 5,341,388 | 8/1994 | Masuda et al. | 372/34 |
| 5,504,762 | 4/1996 | Hutchison | 372/29 |
| 5,668,826 | 9/1997 | Bezinge et al. | 372/43 |
| 5,809,050 | 9/1998 | Baldwin et al. | 372/43 |

FOREIGN PATENT DOCUMENTS

| | | |
|---|---|---|
| 0 100 086 | 2/1984 | European Pat. Off. . |
| 0 732 781 A1 | 9/1996 | European Pat. Off. . |
| 60-180183 | 9/1985 | Japan . |
| 61-214594 | 9/1986 | Japan . |
| 1-010686 | 1/1989 | Japan . |
| 1-030034 | 1/1989 | Japan . |
| 2-308587 | 12/1990 | Japan . |
| 3-091283 | 4/1991 | Japan . |
| 8-036122 | 2/1996 | Japan . |

*Primary Examiner*—Rodney Bovernick
*Assistant Examiner*—Yisun Song
*Attorney, Agent, or Firm*—Limbach & Limbach L.L.P.

[57] ABSTRACT

A sealed integrating reflective enclosure contains a laser diode, coupling optic, and input ends of transport fibers. A detector is positioned to capture stray scattered radiation emanating from the laser diode emitters and rear facets, coupling optic and transport fiber input ends. The detector is positioned such that stray radiation undergoes at least one reflection within the enclosure before being detected by the detector. The detector can be positioned inside the integrating enclosure, or outside the integrating enclosure opposite a detection hole that is sealed by a translucent diffuser or window. The reflected integrated light detected by the detector is an accurate indication of the optical output generated by the laser diode and coupled into the transport fibers.

34 Claims, 4 Drawing Sheets

LASER DIODE INTEGRATING ENCLOSURE AND DETECTOR

This application claims benefit of Provisional Appl. 60/037,476, filed Feb. 7, 1997.

FIELD OF THE INVENTION

The present invention relates to laser diodes, and more particularly to a laser diode enclosure and detector used to measure the operating parameters of a laser diode.

BACKGROUND OF THE INVENTION

A multi-emitter laser diode produces a plurality of optical beams, one from each emitter. A common method of delivering the laser diode optical output to an intended application includes coupling the optical beams into a bundle of transport optical fibers. The input ends of the transport fibers are aligned to the laser diode emitters. Coupling optics are placed between the emitters and the transport fiber input ends to properly focus the laser diode output beams into the array of transport fibers. The laser diode, coupling optics and transport fiber input ends are enclosed inside a sealed fiber array package to prevent contamination of the laser diode emitters, coupling optics and transport fiber input ends.

It is desirous to monitor the operating parameters of the laser diode, such as output power, wavelength, pulse width, etc., during operation. The measured operating parameters are used to maximize the operating performance of the laser diode and/or the intended application.

One method of monitoring the laser diode output is to place a beam sampling device, such as a beam splitter, between the laser diode emitters and the input ends of the transport fibers. The sampling device directs a portion of the output beams into a detector. The use of such sampling devices, however, has several drawbacks. The distance between the laser diode and the coupling optics is very small. It is difficult to place a beam sampling device in such a small space. It is also mechanically difficult to place a beam sampling device between the coupling optics and the transport fibers that would maintain proper alignment, be reasonably uncomplicated and not take up excessive space. Further, a sampling device disposed between the laser diode and transport fibers would divert optical output that otherwise would be focused into the transport fibers, thus reducing the intensity of the optical output delivered to the intended application. Moreover, the sampling device would be an additional optical element along the optical path from the laser diode to the intended application that would be susceptible to misalignment and contamination. Lastly, such a sampling device must sample a portion of each beam emitted from the diode such that the energy directed to the detector properly exemplifies the overall output characteristics of all of the output beams from the laser diode.

Another method of monitoring the laser diode output is to directly monitor the light transported by the transport fiber. The light exiting the transport fiber can be sampled using a beam splitter, and the remaining light focused back into another transport fiber for delivery to the intended application. However, this method also diverts optical output that otherwise would be delivered to the intended application. Further, this method involves including additional optical elements in the laser diode delivery system, which are susceptible to contamination and misalignment.

One solution to simplify laser diode performance monitoring is described in U.S. Pat. No. 5,504,762, issued to Hutchison. This patent illustrates the well known technique of placing a cylindrical fiber lens lengthwise across the emitters to collimate/focus each of the laser diode beams into the transport fibers. Stray radiation is emitted out either end of the fiber lens along a stray radiation emission path, generally perpendicular to the emitter region emission path. A detector is positioned along the stray radiation emission path to monitor the performance of the laser diode.

There are, however, several disadvantages to the Hutchison configuration. First, the technique described in this patent does not necessarily measure the laser diode output with accuracy. Several factors can cause this stray radiation exiting the fiber lens to change relative to the overall laser diode output. For example, it can be envisioned that certain misalignments of the optical elements could vary the intensity, direction or divergence of the stray radiation exiting the fiber lens end while not introducing a corresponding change in the laser diode output, and/or the output energy coupled into the transport fibers. In addition, selective contamination of the coupling optics could significantly affect the intensity of scattered light while not introducing a corresponding change of laser diode power intensity or coupling efficiency. Further, the detector has to be placed adjacent the fiber lens, most likely inside the sealed package, to properly capture the diverging stray radiation emanating from the fiber lens. Therefore, the detector cannot be serviced or replaced without breaking the seal on the protective packaging. Moreover, optical filters and diagnostic tools cannot be introduced into the light before the light enters the detector. In addition, detector alignment to the stray radiation path would be critical. Any misalignment of the detector, either before or after fabrication of the laser diode package, would result in significant changes in the signal output of the detector. Lastly, sealed lead connections through the packaging walls are necessitated to extract the electrical signals from the detector out of the sealed protective packaging.

There is a need for a detection system that simply and accurately measures the output characteristics of a laser diode during operation. This detection system should not divert any light that otherwise would be focused into the transport fibers, and should minimize detection error due to optical element misalignment or contamination. In addition, it is preferable that such a detection system include a detector that is accessible without intruding within the sealed protective packaging surrounding the laser diode and coupling optics.

SUMMARY OF THE INVENTION

The present invention solves the aforementioned problems by providing a sealed integrating reflective enclosure around the laser diode and input ends of the transport fibers, and by positioning a detector to capture stray radiation that has performed integrating reflections within the enclosure. It has been discovered by the present inventors that the light scattered and reflected inside the integrating enclosure accurately represents the optical output of the laser diode and the optical output coupled into the transport fibers.

The present invention is a laser diode detector assembly that has an enclosure defining a volume therein for containing a plurality of elements. The plurality of elements includes a laser diode which produces an optical output out of a front side thereof, and at least one optical fiber having an input end disposed adjacent the front side of the laser diode to optically couple the optical output into the optical fiber. A portion of the optical output is not coupled into the optical fiber and is directed out into the volume as stray light which undergoes multiple reflections off of internal surfaces of the enclosure and the plurality of elements therein. A detector is positioned to detect at least a portion of the stray light only after the stray light has undergone at least one of the reflections.

In another aspect of the present invention, the laser diode detector assembly has an enclosure defining a volume therein for containing a plurality of elements, which includes a laser diode which produces an optical output out of a front side thereof, at least one optical fiber having an input end disposed adjacent the front side of the laser diode, and a coupling optic disposed inside the enclosure and adjacent the front side of the laser diode to couple the optical output into the input end of the optical fiber. A portion of the optical output is not coupled into the optical fiber and is directed out into the volume as stray light which undergoes multiple reflections off of internal surfaces of the enclosure and the plurality of elements therein. A detector is positioned to detect at least a portion of the stray light only after the stray light has undergone at least one of the reflections.

In yet another aspect of the present invention, the laser diode detector assembly has an enclosure defining a volume therein and includes a wall that defines a hole therein. The volume contains a plurality of elements that includes a laser diode which produces an optical output out of a front side thereof, and at least one optical fiber having an input end disposed adjacent the front side of the laser diode to optically couple the optical output into the optical fiber. A portion of the optical output is not coupled into the optical fiber and is directed out into the volume as stray light which undergoes multiple reflections off of internal surfaces of the enclosure and the plurality of elements therein. The hole is positioned to transmit at least a portion of the stray light therethrough and out of the enclosure only after the stray light has undergone at least one of the reflections.

Other objects and features of the present invention will become apparent by a review of the specification, figures and claims.

DETAILED DESCRIPTION OF THE PREFERRED EMBODIMENTS

Figure 1:
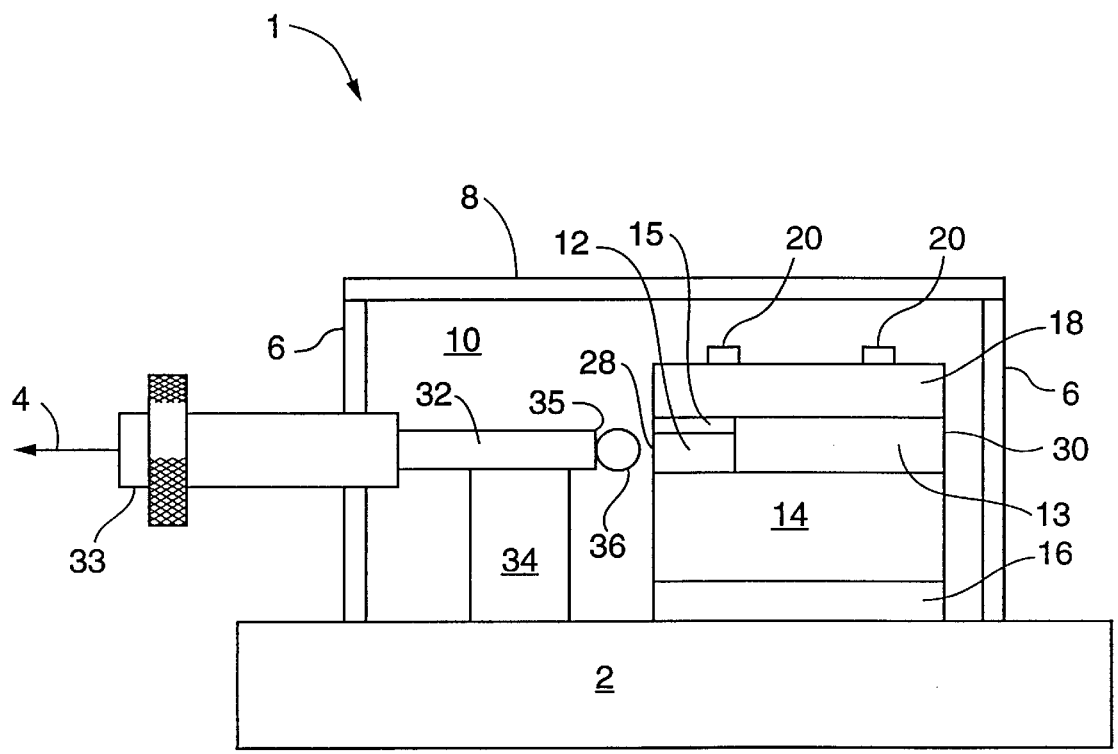
FIG. 1 is a cross-sectional side view of the laser diode integrating enclosure of the present invention.
Figure 2:
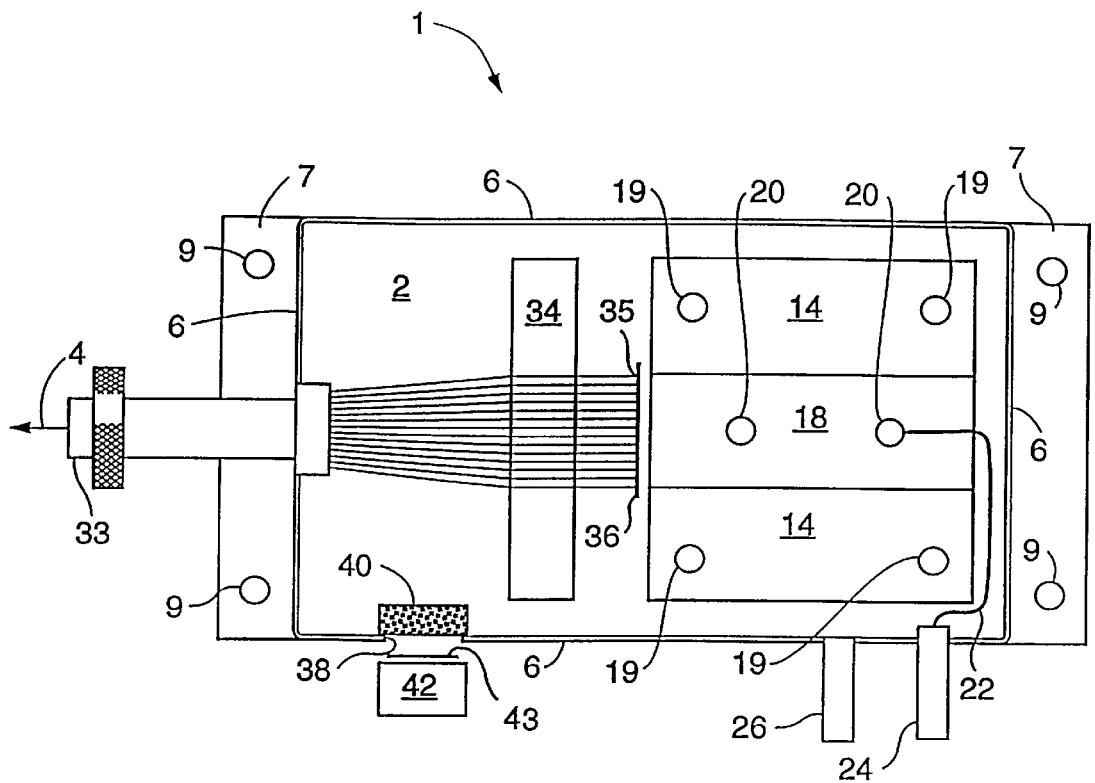
FIG. 2 is a top view of the laser diode integrating enclosure of the present invention, without the lid in place.
Figure 3:
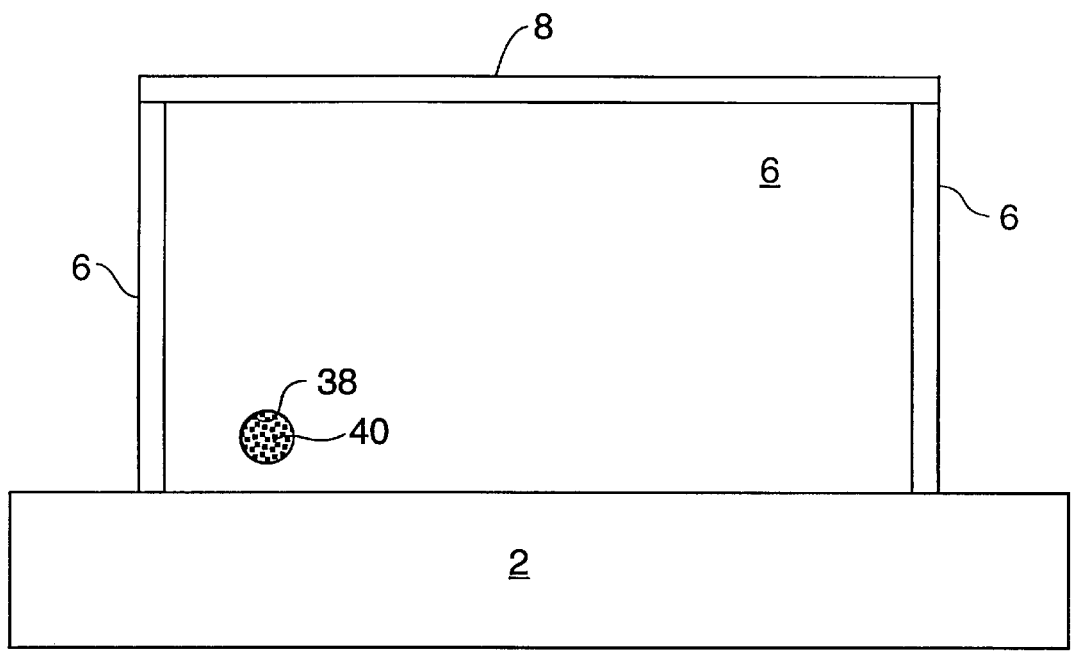
FIG. 3 is a side view of the laser diode integrating enclosure of the present invention illustrating the detector hole formed in the sidewall.

The present invention is a sealed laser diode integrating enclosure 1 in combination with a detection system that accurately measures the output operating parameters of a laser diode. The integrating enclosure 1 is illustrated in FIGS. 1–3, and includes a base plate 2, side walls 6 attached to the base plate 2, and a lid 8 attached to the upper edges of the side walls 6. The base plate 2, side walls 6 and lid 8 define a sealed volume 10 therein. Base plate 2, walls 6 and lid 8 are made of a reflective material, and/or are coated or plated with a specular or diffuse reflective material, such as gold, nickel or titanium oxide. Through-holes 9 are formed in mounting flange portions 7 of base plate 2 to receive bolts or screws to mount the base plate 2, for example, to a thermoelectric cooler.

Inside the sealed volume 10, a heatsink 14 is mounted to the base plate 2 with an indium seal 16 therebetween via screws 19. A laser diode 12 and insulator block 13 are mounted between the heat sink 14 and a cathode plate 18, which is attached by screws 20. The laser diode 12 is preferably soldered to the heat sink 14 for good thermal and electrical conduction. A copper foil lead 15 electrically couples the top cathode surface of the laser diode 12 to the cathode plate 18. The heatsink 14 and indium seal 16 facilitate electrical and thermal conduction between the laser diode 12 and the base plate 2. A cathode lead wire 22 has one end attached to one of the screws 20, and the other end attached to a cathode wall lead 24. The cathode wall lead 24 passes through, and is electrically insulated from, side wall 6. An anode wall lead 26 is attached to or formed with, and is electrically conductive with, side wall 6.

When a voltage is placed across the anode and cathode wall leads 24/26, electrical current passes through the lead wire 22, cathode plate 18, copper foil 15, laser diode 12, heatsink 14, indium seal 16, base plate 2, wall 6, and out to anode wall lead 26. The electrical current passing through the laser diode 12 produces an optical output 4 that exits the laser diode 12 through a plurality of emitters 28 oriented in a line parallel to the heatsink 14. The rear facets 30 of the laser diode 12 are coated with a reflective coating, which may leak a minimal amount of light during operation. Heat generated by the laser diode 12 is conducted away from the laser diode 12 through heatsink 14, indium seal 16 and base plate 2.

Figure 4:
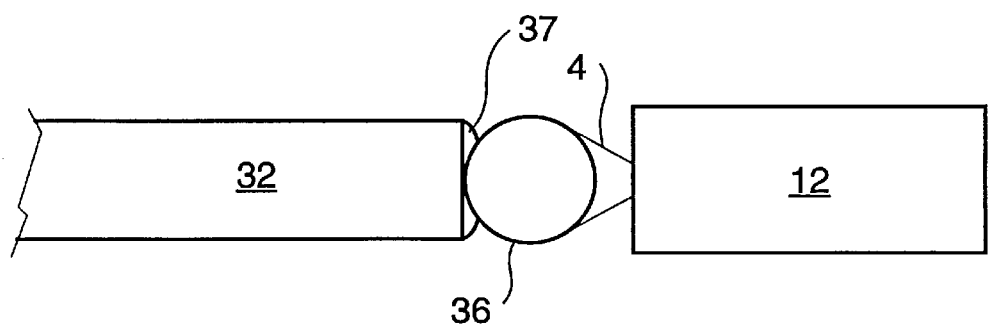
FIG. 4 is a side view of the cylindrical lens used to focus the laser diode output in the transport fibers.

An array of transport fibers 32 is attached to a support block 34, preferably by solder or glue, such that the input ends 35 of the fibers 32 are aligned to the emitters 28 of the laser diode 12. The transport fibers 32 extend out through one of the side walls 6, or terminate in an optical coupler 33 (i.e. an SMA connector, etc.) as shown in FIGS. 1–3, for butt coupling to a delivery optical fiber that directs the laser diode output to the intended application. A cylindrical lens 36 is glued, using a transparent glue 37, across the input ends 35 of the fibers 32 to collimate/focus the output of each laser diode emitter 28 into the corresponding fiber 32, as illustrated in FIG. 4. In the preferred embodiment, the cylindrical lens 36 is spaced approximately 30 $\mu$m from the diode emitters 28. The refractive index of the cylindrical lens 36, glue 37, and transport fibers 32 are 1.82, 1.52 and 1.48 respectively. Transparent glue can be obtained from Epoxy Technology Inc, Billerica, Mass., under the tradename EPO-Tek 377.

During diode laser operation, most of the light generated by the laser diode 12 is focused by the cylindrical lens 36 into the transport fibers 32. However, some light is randomly scattered out into the sealed volume 10. Sources of the randomly scattered light include surface reflections from the light entering the cylindrical lens 36, internal reflections inside the cylindrical lens 36 that exit out its curved surface and both its end surfaces, reflections off of the front surface of the input ends 35 of the transport fibers 32, reflections and scattering from the glue 37 as the light beams 4 pass therethrough, wide angle emissions from the emitters 28 that are not captured by the cylindrical lens 36, and/or leakage light passing out through the rear facets 30 of the laser diode 12. The lens 36, glue 37 and fibers 32 can be coated with an anti-reflection coating to minimize the light that is randomly scattered. The scattered light undergoes multiple reflections off of the inner surfaces of lid 8, walls 6, and base plate 2, as well as any other elements contained within the sealed enclosure 1.

A detector hole 38 is formed in one of the side walls 6. The hole 38 is positioned such that any of the randomly scattered light generated from the above listed sources cannot reach the hole without reflecting at least once off of the walls 6, lid 8, base plate 2, and/or any other component within sealed enclosure 1. The position of detector hole 38 illustrated in FIGS. 2 and 3 is close enough to base plate 2 such that there is no direct line of sight between the detector hole 38 and the cylindrical lens 32, glue 37, or the emitters 28 and rear facets 30 of the laser diode 12 (i.e. the direct line of sight is blocked by support block 34). The multiple reflections inside the enclosure 1 act to integrate all these sources of scattered light. The integrated scattered light has been found to very accurately represent the light actually produced by the laser diode 12 and coupled into the transport fibers 32.

A diffuser 40, such as a thin piece of translucent alumina (i.e. 0.01" thick) or transparent window material, is mounted over and seals the hole 38 to prevent contaminants from entering the sealed volume 10. The diffuser 40 couples a fraction of the reflected stray light out of the enclosure 1. A detector 42 is positioned adjacent the diffuser 40 to measure the integrated light passing through the diffuser 40. The detector 42 can be used to measure power, wavelength, pulse width etc., which will accurately represent the power, wavelength, pulse width, etc. of the light generated by the laser diode 12 and coupled into the transport fibers 32. Therefore, for example, an electrical signal proportional to light being transmitted through the transport fibers 32 can be generated by the detector 42.

The multiple reflections of the scattered light within the integrating enclosure 1 act to integrate the various sources of scattered light. Optical alignment, material degradation, contamination, etc. can affect the amount, direction and divergence of light scattered by any one of the sources listed above. Therefore, over time, the light scattered by a single element may not accurately represent the light produced by the laser diode 12 and coupled into the transport fibers 32. However, monitoring the integrated scattered light within the enclosure 1, which represents light scattered by the lens 36, glue 37, transport fibers 32 and laser diode 12, minimizes detection error.

The are several advantages to having the detector 42 positioned outside the sealed volume 10. The detector 42 can be serviced, replaced or changed (i.e. from a power detector to a wavelength detector) without having to access the sealed integrating enclosure 1. The integrating enclosure 1 is best assembled in a clean room to keep the sealed volume 10 free of contaminants. The configuration illustrated in FIGS. 1–3 allows the detector 42 to be accessed after final assembly without risking contamination of the sealed volume 10. Wavelength dependent filters 43 can be selectively inserted between the diffuser 40 and the detector 42 to make wavelength sensitive measurements. In addition, the diffuser 40 can be used as an emission indicator, whereby visual inspection, either with or without an infrared scope, would indicate whether the laser diode 12 was producing optical energy.

Figure 5:
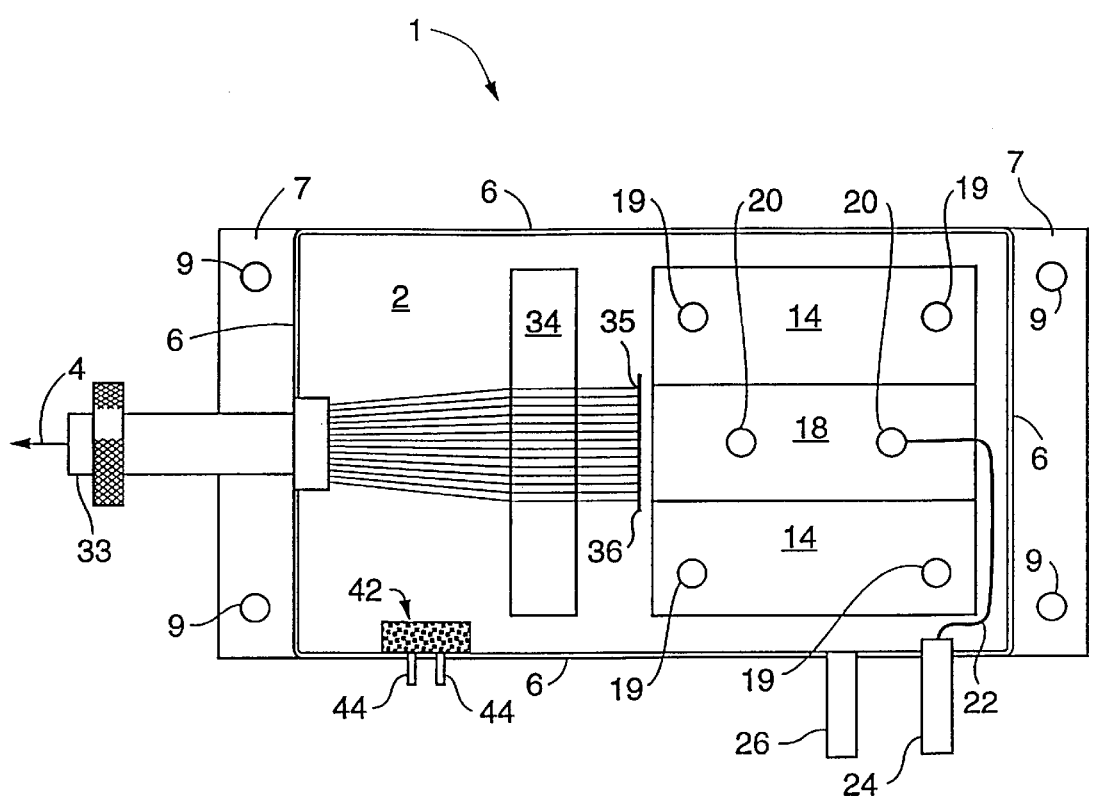
FIG. 5 is a top view of an alternate embodiment of the present invention where the detector is positioned inside the integrating enclosure.

While it is preferable to position the detector 42 outside the sealed integrating enclosure 1, FIG. 5 shows an alternate embodiment of the present invention with the detector 42 located inside the sealed integrating enclosure 1. The detector 42 can be placed anywhere within the sealed volume 10 so long as there is no direct line of sight between a source of scattered light and the detector 42. Sealed lead connectors 44 pass the electric signal from the detector 42 through wall 6 and out of the sealed volume 10.

It is to be understood that the present invention is not limited to the embodiments described above and illustrated herein. For example, the laser diode could be a single emitter diode coupled to a single transport fiber. Further, the present invention is not limited to the use of a cylindrical focusing lens or transport fiber delivery systems, but instead encompasses any other coupling optic/delivery system arrangement that efficiently directs the laser diode output out of the sealed diode enclosure. For example, it is well within the scope of the present invention to position the input ends of the optical fibers adjacent the laser diode to directly couple the laser diode output into the optical fibers without using coupling optics. Lastly, a plurality of detector holes and detectors can be used to monitor the performance of the laser diode.

What is claimed is:

1. A laser diode detector assembly, comprising:
   an enclosure defining a volume therein;
   a plurality of elements disposed in the volume, including:
      a laser diode which produces an optical output out of a front side of said laser diode, and
      at least one input end of at least one optical fiber disposed adjacent said front side of said laser diode to optically couple said optical output into said optical fiber, the optical fiber traversing out of said enclosure, wherein a portion of said optical output is not coupled into said optical fiber and is directed out into said volume as stray light which undergoes multiple reflections off of internal surfaces of said enclosure and said plurality of elements therein for integrating the stray light; and
   a detector positioned to detect at least a portion of said integrated stray light only after said stray light has undergone at least one of said reflections.

2. The laser diode detector assembly of claim 1, wherein at least a portion of said reflected stray light detected by said detector has undergone at least one reflection off of said enclosure.

3. A laser diode detector assembly, comprising:
   an enclosure defining a volume therein containing a plurality of elements including:
      a laser diode which produces an optical output out of a front side of said laser diode, and
      at least one optical fiber having an input end disposed adjacent said front side of said laser diode to optically couple said optical output into said optical fiber, wherein a portion of said optical output is not coupled into said optical fiber and is directed out into said volume as stray light which undergoes multiple reflections off of internal surfaces of said enclosure and said plurality of elements therein; and
   a detector positioned to detect at least a portion of said stray light only after said stray light has undergone at least one of said reflections:
   wherein at least a portion of said reflected stray light detected by said detector has undergone at least one reflection off of said enclosure, and wherein said stray light includes at least one of a portion of the optical output which is scattered by said optical fiber out into said volume and a wide angle emission portion of said optical output which is directed out into said volume and not to said optical fiber.

4. The laser diode detector assembly of claim 3, wherein said stray light further includes a leakage optical output generated by said laser diode which is directed out of a rear side thereof into said volume.

5. The laser diode detector assembly of claim 3, further comprising:
a coupling optic disposed inside said enclosure and adjacent said front side of said laser diode to couple the optical output from said laser diode into said input end of said optical fiber, wherein said stray light further includes a portion of the optical output which is scattered by said coupling optic out into said volume.

6. The laser diode detector assembly of claim 5, wherein said coupling optic is a cylindrical lens attached to said input end of said optical fiber.

7. The laser diode detector assembly of claim 2, wherein said enclosure includes a wall that defines a hole therein, said hole is positioned to transmit therethrough only said reflected stray light out of said enclosure, said detector is disposed outside said enclosure and adjacent said hole to detect said transmitted reflected stray light.

8. The laser diode detector assembly of claim 7, further comprising at least one of a translucent diffuser and a transparent window covering said hole that transmits said reflected stray light through said hole.

9. The laser diode assembly of claim 7, further comprising:
an optical filter disposed between said hole and said detector.

10. The laser diode detector assembly of claim 2, wherein said detector is disposed inside said enclosure.

11. The laser diode detector assembly of claim 2, wherein said enclosure is made of a reflective material.

12. The laser diode detector assembly of claim 2, wherein said laser diode is a laser diode bar, and said at least one optical fiber is a plurality of optical fibers.

13. A laser diode detector assembly, comprising:
an enclosure defining a volume therein;
a plurality of elements disposed in the volume, including:
a laser diode which produces an optical output out of a front side of said laser diode,
an input end of at least one optical fiber disposed adjacent said front side of said laser diode, the optical fiber traversing out of said enclosure, and
a coupling optic disposed inside said enclosure and adjacent said front side of said laser diode to couple the optical output into said input end of said optical fiber, wherein a portion of said optical output is not coupled into said optical fiber and is directed out into said volume as stray light which undergoes multiple reflections off of internal surfaces of said enclosure and said plurality of elements therein for integrating the stray light; and
a detector positioned so that there is no direct line of sight between the detector and the front side, the coupling optic and the input end so as to detect at least a portion of said integrated stray light only after said stray light has undergone at least one of said reflections.

14. The laser diode detector assembly of claim 13, wherein at least a portion of said reflected stray light detected by said detector has undergone at least one reflection off of said enclosure.

15. A laser diode detector assembly, comprising:
an enclosure defining a volume therein containing a plurality of elements including:
a laser diode which produces an optical output out of a front side of said laser diode,
at least one optical fiber having an input end disposed adjacent said front side of said laser diode, and
a coupling optic disposed inside said enclosure and adjacent said front side of said laser diode to couple the optical output into said input end of said optical fibers wherein a portion of said optical output is not coupled into said optical fiber and is directed out into said volume as stray light which undergoes multiple reflections off of internal surfaces of said enclosure and said plurality of elements therein; and
a detector positioned to detect at least a portion of said stray light only after said stray light has undergone at least one of said reflections:
wherein at least a portion of said reflected stray light detected by said detector has undergone at least one reflection off of said enclosure, and wherein said stray light includes at least one of a portion of the optical output which is scattered by said coupling optic out into said volume, a portion of the optical output which is scattered by said optical fiber out into said volume, a wide angle emission portion of said optical output which is directed out into said volume and not to said optical fiber, and a leakage optical output generated by said laser diode which is directed out of a rear side thereof into said volume.

16. The laser diode detector assembly of claim 13, wherein said enclosure includes a wall that defines a hole therein, at least one of a translucent diffuser and a transparent window covering said hole, said hole is positioned such that said one of said translucent diffuser and said transparent window transmits only said reflected stray light out of said enclosure, said detector is disposed outside said enclosure and adjacent said hole to detect said transmitted reflected stray light.

17. The laser diode assembly of claim 16, further comprising:
an optical filter disposed between said hole and said detector.

18. The laser diode detector assembly of claim 14, wherein said detector is disposed inside said enclosure.

19. The laser diode detector assembly of claim 14, wherein said coupling optic is a cylindrical lens attached to said input end of said optical fiber.

20. The laser diode detector assembly of claim 14, wherein said enclosure is made of a reflective material.

21. The laser diode detector assembly of claim 14, wherein said laser diode is a laser diode bar, and said at least one optical fiber is a plurality of optical fibers.

22. A laser diode assembly, comprising:
an enclosure defining a volume therein and including a wall that defines a hole therein;
a plurality of elements disposed in the volume, including:
a laser diode which produces an optical output out of a front side of said laser diode, and
a coupling optic disposed adjacent said front side of said laser diode to focus the optical output from said laser diode;
at least one input end of at least one optical fiber disposed adjacent said coupling optic to optically couple said focused optical output into said optical fiber, wherein a portion of said optical output is not coupled into said optical fiber and is directed out into said volume as stray light which undergoes multiple reflections off of internal surfaces of said enclosure and said plurality of elements therein for integrating the stray light;

wherein said hole is positioned so that there is no direct line of sight between the hole and the front side, the coupling optic and the input end so as to transmit at least a portion of said integrated stray light therethrough and out of said enclosure only after said stray light has undergone at least one of said reflections.

23. The laser diode assembly of claim 22, further comprising at least one of a translucent diffuser and a transparent window covering said hole that transmits said reflected stray light through said hole.

24. The laser diode assembly of claim 22, wherein at least a portion of said reflected stray light transmitted through said hole has undergone at least one reflection off of said enclosure.

25. A laser diode assembly, comprising:
an enclosure defining a volume therein and including a wall that defines a hole therein, said volume containing a plurality of elements including:
a laser diode which produces an optical output out of a front side of said laser diode, and
at least one optical fiber having an input end disposed adjacent said front side of said laser diode to optically couple said optical output into said optical fiber, wherein a portion of said optical output is not coupled into said optical fiber and is directed out into said volume as stray light which undergoes multiple reflections off of internal surfaces of said enclosure and said plurality of elements therein, wherein said hole is positioned to transmit at least a portion of said stray light therethrough and out of said enclosure only after said stray light has undergone at least one of said reflections;
wherein at least a portion of said reflected stray light transmitted through said hole has undergone at least one reflection off of said enclosure, and wherein said stray light includes at least one of a portion of the optical output which is scattered by said optical fiber out into said volume, a wide angle emission portion of said optical output which is directed out into said volume and not to said optical fiber, and a leakage optical output generated by said laser diode which is directed out of a rear side thereof into said volume.

26. The laser diode assembly of claim 25, further comprising:
a coupling optic disposed inside said enclosure and adjacent said front side of said laser diode to couple the optical output from said laser diode into said input end of said optical fiber, wherein said stray light further includes a portion of the optical output which is scattered by said coupling optic out into said volume.

27. The laser diode assembly of claim 26, wherein said coupling optic is a cylindrical lens attached to said input end of said optical fiber.

28. The laser diode assembly of claim 24, further comprising:
a detector positioned outside said enclosure and adjacent said hole to detect at least a portion of said reflected stray light transmitted through said hole.

29. The laser diode assembly of claim 28, further comprising:
an optical filter disposed between said hole and said detector.

30. The laser diode assembly of claim 24, wherein said enclosure is made of a reflective material.

31. The laser diode detector assembly of claim 24, wherein said laser diode is a laser diode bar, and said at least one optical fiber is a plurality of optical fibers.

32. The laser diode detector assembly of claim 1, wherein the plurality of elements includes at least one or more elements disposed to block any direct lines of sight between the detector and the front side of the laser diode and the input end of the optical fiber.

33. The laser diode detector assembly of claim 13, wherein the plurality of elements includes at least one or more elements disposed to block any direct lines of sight between the detector and the front side of the laser diode, the coupling optic and the input end of the optical fiber.

34. The laser diode detector assembly of claim 13, wherein the plurality of elements includes at least one or more elements disposed to block any direct lines of sight between the hole and the front side of the laser diode, the coupling optic and the input end of the optical fiber.

* * * * *